United States Patent
Tsai et al.

(10) Patent No.: US 8,736,015 B2
(45) Date of Patent: May 27, 2014

(54) INTEGRATED CIRCUIT STRUCTURE AND METHOD OF FORMING THE SAME

(75) Inventors: Yao-Jen Tsai, Kaohsiung (TW); Chih-Fu Chang, Neipu Township (TW); Chih-Kang Chuang, Tainan (TW); Yee-Ren Wuang, Tainan (TW); David Yen, Chu-Bak (TW); Yuan-Jen Liao, Zhongli (TW); Shih-Che Fang, Tainan (TW); Hung-Che Hsueh, Tainan (TW); Chih Mou Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 13/246,495

(22) Filed: Sep. 27, 2011

(65) Prior Publication Data
US 2013/0075856 A1    Mar. 28, 2013

(51) Int. Cl.
*H01L 29/06* (2006.01)
(52) U.S. Cl.
USPC ............... 257/503; 257/E27; 257/E21.598

(58) Field of Classification Search
USPC ............ 257/E27, E23.3, 292, E21.598, 257/E25.032, 503; 438/99, FOR. 211
See application file for complete search history.

(56) References Cited

U.S. PATENT DOCUMENTS

| | | | | |
|---|---|---|---|---|
| 5,515,319 | A  * | 5/1996 | Smayling et al. | 365/185.27 |
| 2004/0033666 | A1 * | 2/2004 | Williams et al. | 438/297 |
| 2005/0045909 | A1 * | 3/2005 | Zhang | 257/173 |
| 2006/0261249 | A1 * | 11/2006 | Raynor | 250/208.1 |
| 2006/0289937 | A1 * | 12/2006 | Li et al. | 257/362 |
| 2008/0259511 | A1 * | 10/2008 | Worley | 361/56 |
| 2010/0279459 | A1 * | 11/2010 | Huang et al. | 438/98 |

* cited by examiner

*Primary Examiner* — Marc Armand
(74) *Attorney, Agent, or Firm* — Slater and Matsil, L.L.P.

(57) ABSTRACT

An embodiment is an integrated circuit (IC) structure. The structure comprises a deep n well in a substrate, a first pickup device in the deep n well, a first signal device in the deep n well, a dissipation device in the substrate, a second signal device in the substrate, a first electrical path between the first pickup device and the dissipation device, and a second electrical path between the first signal device and the second signal device. The dissipation device is outside of the deep n well, and the second signal device is outside of the deep n well. A highest point of the first electrical path is lower than a highest point of the second electrical path.

20 Claims, 3 Drawing Sheets

US 8,736,015 B2

INTEGRATED CIRCUIT STRUCTURE AND METHOD OF FORMING THE SAME

BACKGROUND

Highly integrated semiconductor circuits are increasingly important, particularly in producing battery operated devices such as cell phones, portable computers such as laptops, notebook computers and PDAs, wireless email terminals, MP3 audio and video players, portable wireless web browsers and the like, and these sophisticated integrated circuits increasingly include on-board data storage, logic circuitry, and/or signal processing.

The increased density of devices in integrated circuits and the combination of various types of circuitry, such as logic and radio frequency processing circuits, have generally increased the amount of noise in various circuits. Noise can be detrimental in integrated circuits because the integrity of the signal can be compromised, which can in turn cause a loss of data or errors in logic or signal processing.

Commonly, devices in an integrated circuit are formed in a doped well to isolate substrate noise. The doped well is typically able to reduce noise between other devices in the substrate and devices in the doped well by providing a low resistance path for the noise to travel to a ground node rather than affect devices in the doped well.

In processing these integrated circuits, typically various dielectric layers are formed on the substrate and etched to form openings for metallization layers. A plasma etch process, such as a reactive ion etch (RIE), is common for etching these openings. The openings generally extend to some underlying conductive feature, and the plasma used for the plasma process is able to contact the conductive feature. In structures having devices in the doped well, charges from the plasma can be transferred through the conductive feature to the doped well.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments are generally described in the context of an integrated circuit. Embodiments may be applied to any integrated circuit, for example, a logic circuit, a static random access memory (SRAM), and the like.

Figure 1:
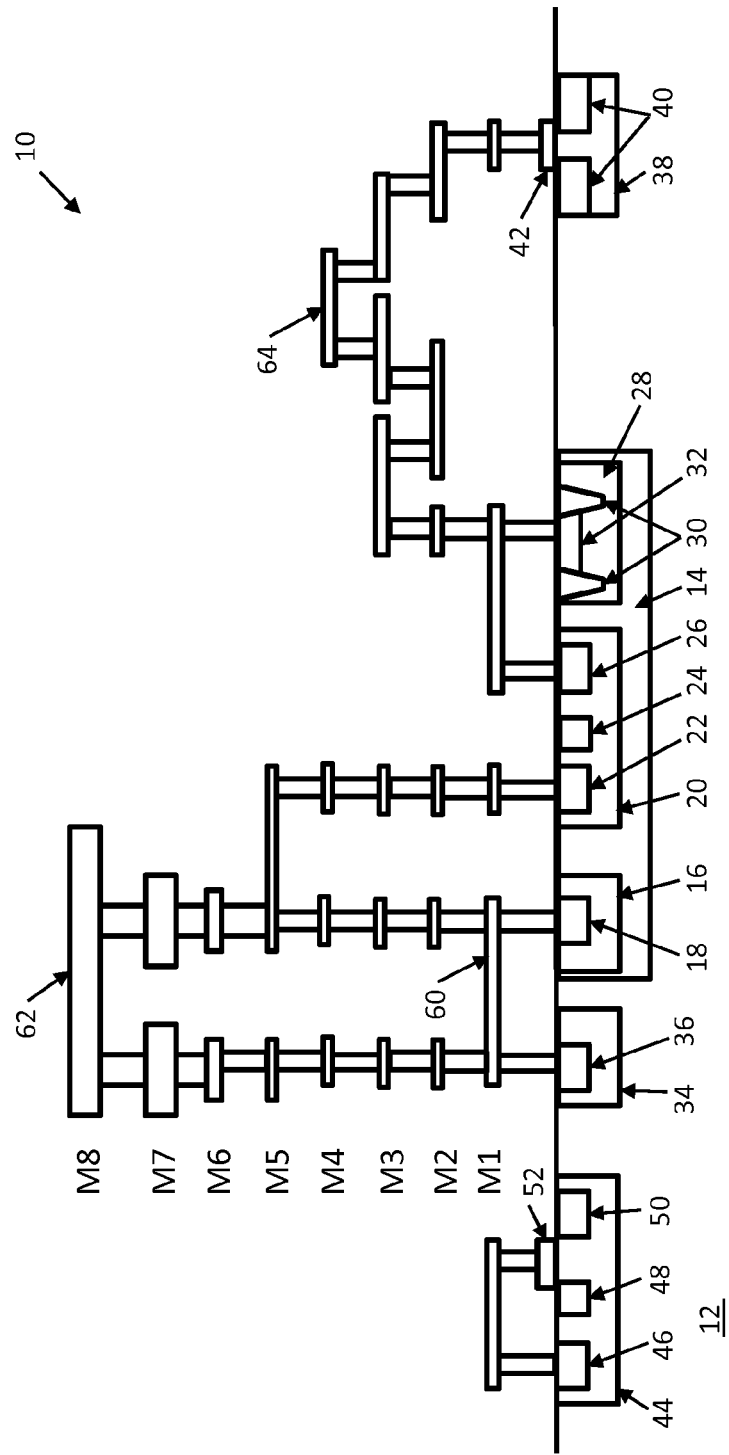
FIG. 1 is an integrated circuit (IC) structure according to an embodiment.

FIG. 1 illustrates an integrated circuit (IC) structure 10 according to an embodiment. The structure 10 comprises a substrate 12, such as a semiconductor substrate. The substrate 12 has a deep n doped well (DNW) 14 formed therein. The DNW 14 includes an n doped well (NW) 16, a NW 20, and a p doped well (PW) 28. Each of the NW 16 and the NW 20 has a higher n dopant concentration than the DNW 14. The NW 16 includes a heavily n doped (N+) active region 18. The NW 20 includes an N+ active region 22, a heavily p doped (P+) active region 24, and a P+ active region 26. The PW 28 includes isolation regions 30 and an N+ active region 32 disposed between the isolation regions 30.

The substrate 12 also includes a NW 34 outside of the DNW 14. An N+ active region 36 is disposed in the NW 34. The substrate 12 further includes a PW 38 outside of the DNW 14 and N+ active regions 40 in the PW 38. A gate structure 42 is over the PW 38 and laterally between the N+ active regions 40 to form components of a transistor, such as an n-type field effect transistor (NFET). The substrate 12 also includes a PW 44. The PW 44 includes a P+ active region 46, N+ active region 48, and N+ active region 50. A gate structure 52 is over the PW 44 laterally between N+ active regions 48 and 50.

In the described embodiments, the N+ active regions and the P+ active regions have a respective dopant impurity concentration of above about, for example, $10^{19}/cm^3$. The NW and PW have a respective dopant impurity concentration of, for example, about $10^{16}/cm^3$ to about $10^{17}/cm^3$. The DNW 14 has a dopant impurity concentration of, for example, about $10^{15}/cm^3$ to about $10^{16}/cm^3$. One skilled in the art will recognize, however, that these dopant impurity concentrations depend upon the specific device type, technology generation, minimum feature size, and the like. It is intended, therefore, that terms relating to dopant concentrations be interpreted in light of the technology being evaluated and not be limited to the described embodiments.

The structure 10 includes an inter-layer dielectric (ILD) layer and inter-metal dielectric (IMD) layers not specifically identified for ease of illustration. A first metallization layer M1 is in a first IMD layer over the ILD layer over the substrate 12. Other metallization layers, shown as a second metallization layer M2 through an eighth metallization layer M8, are on respective ones of the IMD layers. Vias between the metallization layers and through a respective IMD layer electrically couple various portions of the metallization layers. Contacts between the first metallization layer M1 and the substrate 12 and through the first IMD layer and the ILD layer electrically couple various portions of the first metallization layer M1 to active regions in the substrate 12. Different components are not specifically identified by a reference numeral for ease of illustration, and a person having ordinary skill in the art will readily understand and recognize the components by reference to FIG. 1.

The N+ active region 18 and the NW 16 compose a DNW-power (VDD) pickup. The N+ active region 36 and the NW 34 compose a non-DNW-VDD pickup. The non-DNW-VDD pickup has an area as large as allowed by design rule and/or device requirements. The DNW-VDD pickup is electrically coupled to the non-DNW-VDD pickup through a conductive feature 60 in the first metallization layer M1. A contact directly couples the N+ active region 18 of the DNW-VDD pickup and directly couples the conductive feature 60 in the first metallization layer M1. Another contact directly couples the N+ active region 36 of the non-DNW-VDD pickup and directly couples the conductive feature 60 in the first metallization layer M1. These contacts and the conductive feature 60 can be referred to as a first path.

The contacts in the first path and the conductive feature 60 have cross section areas perpendicular to the direction of a current flow through the first path. In embodiments, the cross section areas are as large as allowed by a design rule. For example, the width of the conductive feature perpendicular to a current flow is as large as the design rule allows. These features have different sizes in other embodiments. The conductive feature 60 may be an electrical fuse, or e-fuse, used in the first metallization layer M1.

The DNW-VDD pickup is further electrically coupled to the non-DNW-VDD pickup through a conductive feature 62 in the eighth metallization layer M8. Two stack of vias in the IMD layers between the first metallization layer M1 and the eighth metallization layer M8 and conductive features in the second metallization layer M2 through the seventh metallization layer M7 electrically couple the conductive feature 62 to the conductive feature 60. These stacks of vias and conductive features, including the conductive feature 62, from the N+ active region 18 to the N+ active region 36, can be referred to as a second path. The second path is electrically parallel to the first path.

The N+ active region 22 is electrically coupled to the DNW-VDD pickup, such as if the N+ active region 22 is a body connection to a transistor that has the P+ active regions 24 and 26 as the source/drain regions. The P+ active region 26 is electrically coupled to a diode composed of the N+ active region 32 and the PW 28 through a conductive feature in the first metallization layer M1. The P+ active region 26 and the diode are further electrically coupled through a conductive feature 64 in the fourth metallization layer M4 to a gate structure 42 of the NFET formed in part by the N+ active regions 40 in the PW 38.

In this example, conductive feature 64 is a signal net in the structure 10, for example, between the transistor including the gate structure 42 and the electrically coupled transistor (that includes P+ active regions 24 and 26) and diode (that includes N+ active region 32). The signal net generally is an electrical point through which a signal from or to, for example, logic circuitry or signal processing circuitry flows to some other circuitry. The conductive feature 64 is in a highest metallization layer through which the signal for which the conductive feature 64 is a signal net flows.

In an embodiment, the conductive feature 60 is in a metallization layer that is lower than the lowest of the highest conductive features of paths through which signals will pass to or from devices in the DNW 14. For example, assume the following: devices in the DNW 14 are configured to send or receive separate signals along two separate paths to other circuitry; the highest conductive feature along a first of the two paths is in the fifth metallization layer M5; and the highest conductive feature along a second of the two paths is in the fourth metallization layer M4. Then, under these assumptions, the lowest of the highest conductive features of the paths is in the second path (the highest conductive feature being in the fourth metallization layer M4), and the conductive feature 60 is in the third metallization layer M3 or lower.

During processing, various plasma processes may be used in fabricating the structure 10. For example, a high density plasma (HDP) deposition may be used to deposit the ILD layer or IMD layers. Further, a physical vapor deposition (PVD) that uses a plasma, such as sputtering, may be used to deposit the conductive features, contacts, and vias in the ILD layer or IMD layers. Also, a plasma may be used in etching, such as with a reactive ion etch (RIE), openings or patterns for the conductive features, contacts, and vias. These plasma processes can cause positive charges to accumulate in the DNW 14. As one example, the etching of a via opening to a metallization layer can allow ions to contact the conductive features in the metallization layer, and the charge of the ions can be carried to the DNW 14.

During processing, the conductive feature 60, and thus the first path, is completely formed before a signal path is completed. For example, under the assumptions previously discussed, the first path is completed once the third metallization layer M3 is formed, and the first path is completed before the second path is completed by the formation of the conductive feature in the fourth metallization layer M4. By forming the first path before completing a signal path, a charge accumulated in the DNW 14 may dissipate in a path other than through the signal path and, for example, to a gate structure to cause damage to a gate dielectric.

A conductive feature in a higher metallization layer, such as the conductive feature 62 in the eighth metallization layer M8, can be used as another path during normal operation of the structure 10. For example, in some embodiments, because the conductive feature 60 is in a lower metallization layer, design rules may limit the size of the conductive feature. In such a situation, if a high current flows through the first path, migration of atoms due to the high current may cause the first path to become open along the conductive feature 60. The conductive feature 62 in the eighth metallization layer M8 generally can have a larger cross section area and thus is less prone to an open caused by migration from a high current. Thus, the conductive feature 62 can allow for a more robust current path during the operation of the structure 10.

Figure 2:
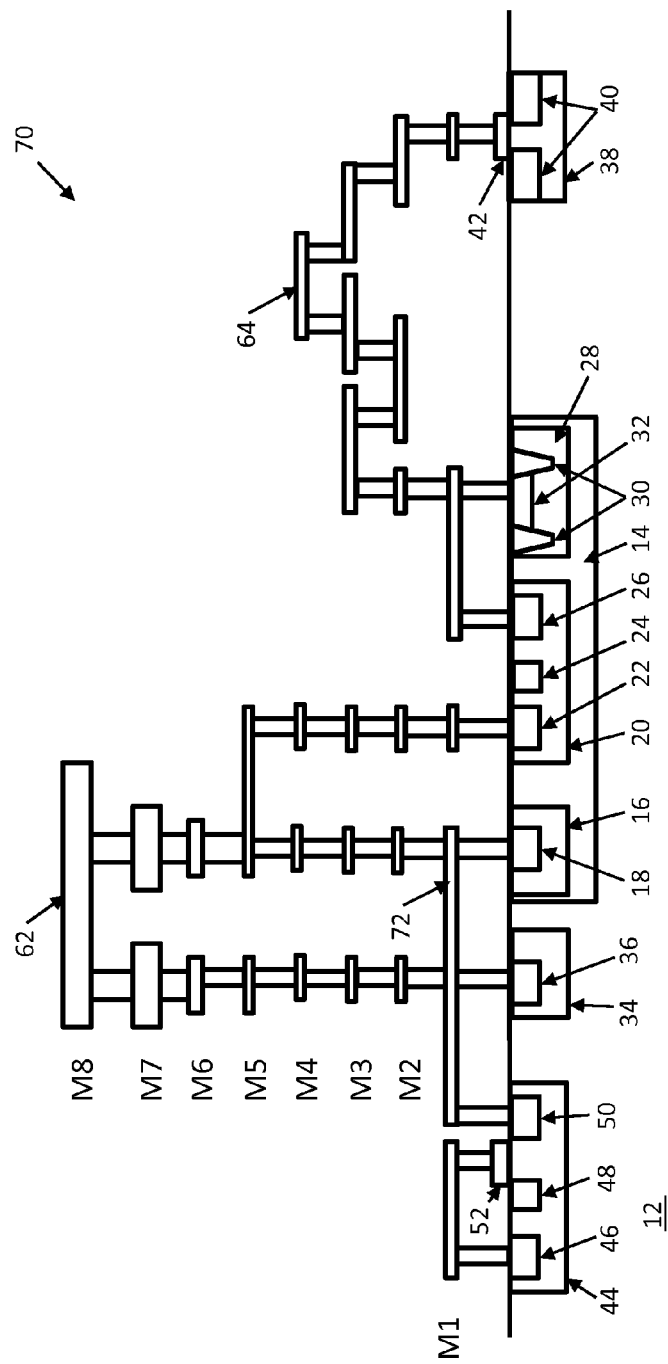
FIG. 2 is another IC structure according to an embodiment.

FIG. 2 illustrates an IC structure 70 according to an embodiment. The IC structure 70 is similar to the IC structure 10 of FIG. 1. Like reference numerals refer to like components, and discussion of repeated components is omitted herein for brevity.

A conductive feature 72 in the first metallization layer M1 is similar to the conductive feature 60 in FIG. 1, and the conductive feature 72 further electrically couples a protection diode. In this embodiment, the substrate 12 includes N+ active region 48, N+ active region 50, and P+ active region 46 in the PW 44. A gate structure 52 of a transistor is over the substrate 12 laterally disposed between the N+ active region 48 and the N+ active region 50. The N+ active regions 48 and 50 form source/drain regions of the transistor, such as an NFET, and the P+ active region 46 forms a body connection to the transistor. Through contacts in the ILD layer and a conductive feature in the first metallization layer M1, the gate structure 52 is electrically coupled to the P+ active region 46, and thus, the transistor is configured as a protection diode. The protection diode is as large as allowed by design rules and/or device requirements in an embodiment. The contact to the N+ active region 18 of the DNW-VDD pickup, the conductive feature 72, and the contact to the N+ active region of the transistor configured as a protection diode can be referred to as a third path. This third path may electrically couple the N+ active region 36 of the non-DNW-VDD pickup, and in other embodiments, the third path is not electrically coupled to the N+ active region 36.

The structure 70 with the conductive feature 72 functions similarly and has generally the same features as the structure 10. Thus, specific discussion of the same functionality and features of the structure 70 is omitted for brevity. The protection diode in the third path, in this embodiment, has a breakdown voltage of greater than about 8.0 V, such as greater than 8.5 V. The non-DNW-VDD pickup in these embodiments has a breakdown voltage of greater than about 15 V. In the structure 70, the third path may dissipate accumulated charges from the DNW at lower charge amounts. Thus, using the third path, the accumulated charge in the DNW may remain at a lower amount compared to using only the non-DNW-VDD pickup in the first path.

Figure 3:
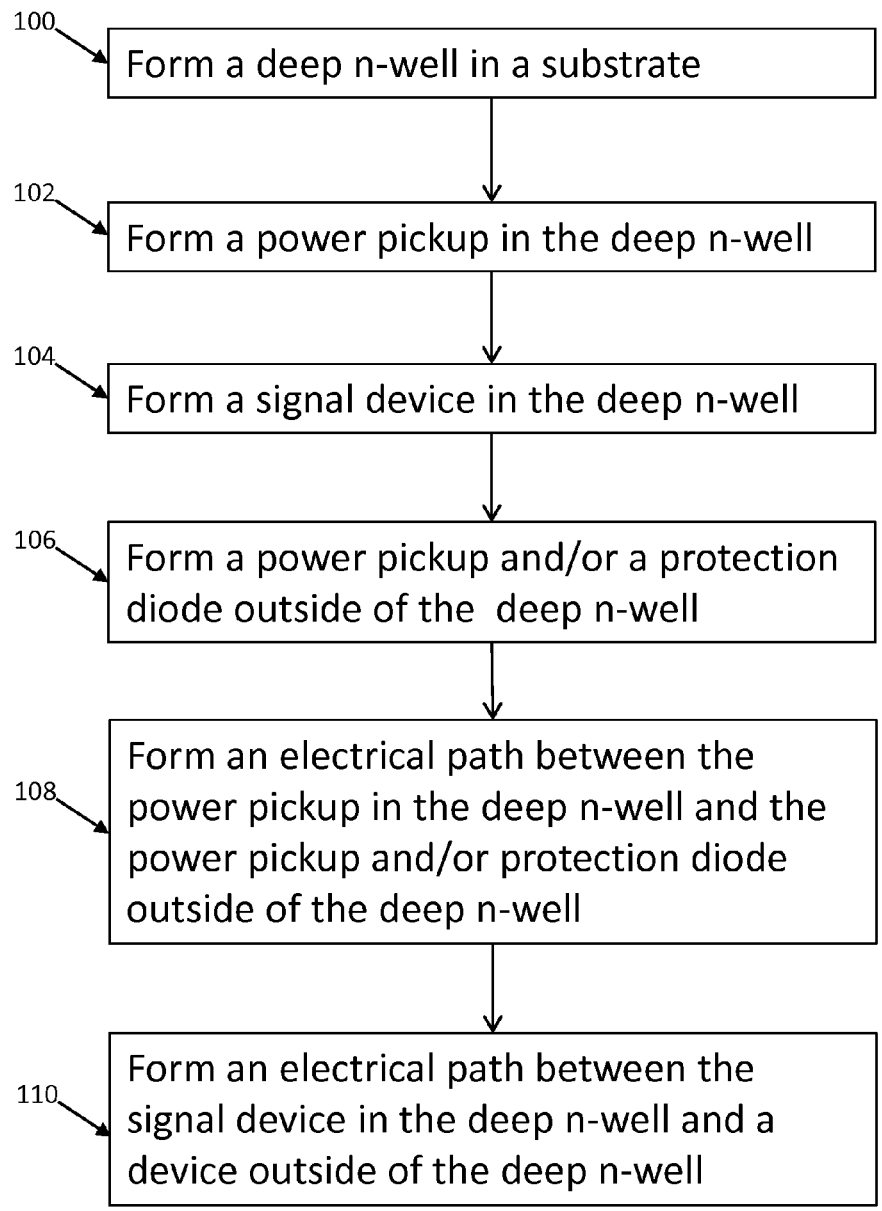
FIG. 3 is a process to form an IC structure according to an embodiment.

FIG. 3 is a process to form a structure according to an embodiment. Although illustrated and described in a particular order, the steps may be performed in any logical order. In step 100, a deep n-well (DNW) is formed in a substrate. The DNW can be formed by masking areas outside of the DNW area of the substrate and implanting the substrate with n-type dopants.

In steps 102, 104, and 106, a power pickup in the DNW is formed, a signal device is formed in the DNW, and a power pickup and/or protection diode outside of the DNW is formed, respectively. Various aspects of these components may be formed in same process steps or different process steps. For example, n-wells for the various components may be formed in a same process step or different steps, and p-wells for various components may be formed in a same process step or different steps.

Using FIGS. 1 and 2 as examples, the NW 16 for the DNW-VDD pickup, the NW 20 for a device in the DNW 14, and the NW 34 for the non-DNW-VDD pickup may be formed by patterning a photoresist over the substrate 12 to expose the surface of the substrate 12 in which the NWs are to be formed and implanting an n-type dopant into the substrate 12. Further, the PW 28 of the diode in the DNW 14, the PW 44 of the protection diode outside of the DNW 14, and the PW 38 of the transistor outside of the DNW 14 may be formed by patterning a photoresist over the substrate 12 to expose the surface of the substrate 12 in which the PWs are to be formed and implanting a p-type dopant into the substrate 12.

Gate structures 42 and 52 may be formed by depositing a gate dielectric layer over the substrate 12 and depositing a gate electrode layer, such as polysilicon, over the gate dielectric layer. The gate dielectric layer and the gate electrode layer can be patterned by acceptable lithography techniques to form the gate structures 42 and 52. The gate structures 42 and 52 may also comprise spacers that are formed by depositing a dielectric material conformally over the gate electrode and gate dielectric layers and etching the dielectric material to pattern the spacers along sidewalls of the gate electrode and gate dielectric.

The N+ active region 22 of the device in the DNW 14, the N+ active region 18 of the DNW-VDD pickup, the N+ active region 36 of the non-DNW-VDD pickup, the N+ active regions 48 and 50 of the protection diode, the N+ active region 32, and the N+ active regions 40 of the device outside of the DNW 14 can be formed by patterning a photoresist over the substrate 12 to expose the surface of the substrate 12 in which the N+ active regions are to be formed and/or using gate structures for a self-aligned implant and implanting an n-type dopant into the substrate 12. Similarly, the P+ active regions 24 and 26 of the device in the DNW 14 and the P+ active region 46 of the protection diode can be formed by patterning a photoresist over the substrate 12 to expose the surface of the substrate 12 in which the P+ active regions are to be formed and/or using gate structures for a self-aligned implant and implanting a p-type dopant into the substrate 12.

In step 108, an electrical path is formed between the power pickup in the DNW and the power pickup and/or protection diode outside of the DNW, and then, in step 110, an electrical path is formed between the signal device in the DNW and a device outside of the DNW. Portions of steps 108 and 110 may be performed in a same process step or in different process steps.

Using FIGS. 1 and 2 as examples, an inter-layer dielectric (ILD) layer is formed over the substrate 12, and a first inter-metal dielectric (IMD) layer is formed over the ILD layer. It will be readily apparent to a person of ordinary skill in the art that various other layers may be formed, such as etch stop layers, although those layers are not specifically described. Contact openings are etched through the first IMD and the ILD to the various active regions in the substrate 12 and/or gate structures on the substrate 12. For example, respective contact openings are etched to the N+ active regions 50, 36, 18, and 32, and to the P+ active region 26. Further, patterns for the first metallization layer M1 are etched in the first IMD layer. These etching steps can be, for example, by a single or dual damascene process, and may be by a plasma etch, such as a reactive ion etch (RIE). A barrier material and a conductive material can then be deposited in the contact openings and the metallization patterns. Excess materials can be removed by a planarization process, such as a chemical mechanical polish (CMP). Thus, contacts to the substrate 12 and the first metallization layer M1 are formed. By referencing FIGS. 1 and 2, it will be readily apparent that portions of both a signal path from the device in the DNW 14 to a device outside of the DNW, such as to the gate structure 42, and a discharge path from the DNW-VDD pickup to the non-DNW-VDD pickup and/or the protection diode are formed during these steps.

As shown in FIGS. 1 and 2, the discharge path(s) from the DNW-VDD pickup to the non-DNW-VDD pickup and/or the protection diode are formed after the formation of the first metallization layer M1. The full signal path from the device in the DNW 14 to the device comprising the gate structure 42 is not formed until the formation of the fourth metallization layer M4. As discussed with regard to FIGS. 1 and 2, the discharge path(s) can be through other metallization layers as long as the full discharge path is formed before a full signal path.

A second IMD layer is then deposited over the first IMD layer. Via openings and a pattern of the second metallization layer M2 are etched in the second IMD layer, for example, by a single or dual damascene process and by using a plasma RIE. A barrier material and conductive material are then deposited into the via openings and pattern in the second IMD. Excess materials may be removed by a planarization process, such as a CMP, thereby forming the second metallization layer M2. Further metallization layers, such as through the eighth metallization layer in FIGS. 1 and 2, can be formed by repeatedly forming an IMD layer, etching via openings and patterns, depositing conductive material and barrier material, and removing excess materials. Various electrical paths, such as a signal path to the device comprising the gate structure 42 or the parallel discharge path through the eighth metallization layer M8 in FIGS. 1 and 2, can be fully formed in this manner.

During various processing steps, such as a plasma etch, ions from a plasma may contact metallization features which may transfer the ion charge to the DNW. By having a discharge path formed before other electrical paths from the DNW are fully formed, the accumulated ion charges may discharge through the discharge path instead of through another path that may cause damage to signal devices, such as by reducing or preventing a discharge to a gate of a signal device reducing or preventing damage to the gate dielectric. Thus, a yield of structures formed as embodiments can improve a yield of the IC chip. Further, a larger window for a plasma rich process can be gained.

An embodiment is an integrated circuit (IC) structure. The structure comprises a deep n well in a substrate, a first pickup device in the deep n well, a first signal device in the deep n well, a dissipation device in the substrate, a second signal device in the substrate, a first electrical path between the first pickup device and the dissipation device, and a second electrical path between the first signal device and the second signal device. The dissipation device is outside of the deep n well, and the second signal device is outside of the deep n well. A highest point of the first electrical path is lower than a highest point of the second electrical path.

Another embodiment is an IC structure. The structure comprises a first pickup device in a deep n well, a first signal device in the deep n well, a dissipation device in a substrate, and a first electrical path between the first pickup device and the dissipation device. The deep n well is in the substrate, and the dissipation device is outside of the deep n well. The first electrical path comprises a first conductive feature in a first dielectric layer over the substrate, and the first conductive feature comprises a highest point above the substrate of the first electrical path. A second electrical path is not between the first signal device and a second signal device in the first dielectric layer, an underlying dielectric layer, or a combination thereof. The second signal device is outside of the deep n well.

A further embodiment is method for forming an integrated circuit structure. The method comprises forming a deep n-well in a substrate; forming a first pickup device in the deep n-well; forming a first signal device in the deep n-well; forming a dissipation device in the substrate and outside of the deep n-well; forming a first electrical path between the first pickup device in the deep n-well and the dissipation device; and after forming the first electrical path, forming a second electrical path between the first signal device in the deep n-well and a second signal device outside of the deep n-well.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) structure comprising:
a deep n well in a substrate;
a first pickup device in the deep n well;
a first signal device in the deep n well;
a dissipation device in the substrate, the dissipation device being outside of the deep n well;
a second signal device in the substrate, the second signal device being outside of the deep n well;
a first electrical path between the first pickup device and the dissipation device; and
a second electrical path between the first signal device and the second signal device, a highest point of the first electrical path being lower than a highest point of the second electrical path.

2. The IC structure of claim 1, wherein the dissipation device comprises a second pickup device.

3. The IC structure of claim 1, wherein the dissipation device comprises a diode.

4. The IC structure of claim 1, wherein the dissipation device comprises a second pickup device and a diode.

5. The IC structure of claim 1, wherein the highest point of the first electrical path is in a first conductive feature in a first dielectric layer, the first dielectric layer being over the substrate, and the highest point in the second electrical path is in a second conductive feature in a second dielectric layer, the second dielectric being over the first dielectric layer.

6. The IC structure of claim 1 further comprising a third electrical path between the dissipation device and the first pickup device, the third electrical path having a highest point that is higher than the highest point of the second electrical path.

7. An integrated circuit (IC) structure comprising:
a first pickup device in a deep n well, the deep n well being in a substrate;
a first signal device in the deep n well;
a dissipation device in the substrate, the dissipation device being outside of the deep n well; and
a first electrical path between the first pickup device and the dissipation device, the first electrical path comprising a first conductive feature in a first dielectric layer over the substrate, the first conductive feature comprising a highest point above the substrate of the first electrical path, a second electrical path not being between the first signal device and a second signal device wholly in the first dielectric layer, one or more underlying dielectric layer, or a combination thereof, the second signal device being outside of the deep n well.

8. The IC structure of claim 7 further comprising the second electrical path between the first signal device and the second signal device, the second electrical path comprising a second conductive feature in a second dielectric layer, the second dielectric layer being over the first dielectric layer.

9. The IC structure of claim 8 further comprising a third electrical path between the first pickup device and the dissipation device, the third electrical path comprising a third conductive feature in a third dielectric layer, the third dielectric layer being over the second dielectric layer.

10. The IC structure of claim 7, wherein the first electric path comprises a first contact and a second contact, the first contact being directly coupled to the first pickup device and the first conductive feature, the second contact being directly coupled to the dissipation device and the first conductive feature.

11. The structure of claim 7, wherein the dissipation device comprises a second pickup device.

12. The structure of claim 7, wherein the dissipation device comprises a diode.

13. An integrated circuit (IC) structure comprising:
a semiconductor substrate comprising:
a deep n well extending from a top surface of the semiconductor substrate to a depth in the substrate;
a first pickup device in the deep n well, the first pickup device extending from the top surface of the semiconductor substrate to a depth in the deep n well;
a first signal device in the deep n well, the first signal device extending from the top surface of the semiconductor substrate to a depth in the deep n well;
a dissipation device in the semiconductor substrate, the dissipation device being external to the deep n well;
a second signal device in the semiconductor substrate, the second signal device being external to the deep n well; and
a plurality of dielectric layers over the top surface of the semiconductor substrate, the plurality of dielectric layers comprising:

a first electrical path between the first pickup device and the dissipation device, the first electrical path comprising a first conductive feature in a first layer of the plurality of the dielectric layers, the first conductive feature being at a greatest distance of the first electrical path from the top surface of the semiconductor substrate and in a direction normal to the top surface of the substrate; and a second electrical path between the first signal device and the second signal device, the second electrical path comprising a second conductive feature in a second layer of the plurality of the dielectric layers, the second conductive feature being at a greatest distance of the second electrical path from the top surface of the semiconductor substrate and in the direction normal to the top surface of the substrate, the second layer of the plurality of the dielectric layers being over the first layer of the plurality of the dielectric layers.

14. The IC structure of claim 13, wherein the dissipation device comprises a second pickup device, each of the first pickup device and the second pickup device comprising an N+ region in an N well, a concentration of n-type impurities in the N+ region being greater than a concentration of n-type impurities in the N well, the concentration of n-type impurities in the N well being greater than a concentration of n-type impurities in the deep n well.

15. The IC structure of claim 13, wherein the dissipation device comprises a diode, the diode being a transistor configured to operate as the diode.

16. The IC structure of claim 13, wherein the dissipation device comprises a second pickup device electrically coupled to a diode, each of the first pickup device and the second pickup device comprising an N+ region in an N well, a concentration of n-type impurities in the N+ region being greater than a concentration of n-type impurities in the N well, the concentration of n-type impurities in the N well being greater than a concentration of n-type impurities in the deep n well, and the diode being a transistor configured to operate as the diode.

17. The IC structure of claim 13, wherein the plurality of dielectric layers further comprise a third electrical path between the dissipation device and the first pickup device, the third electrical path comprising a third conductive feature in a third layer of the plurality of the dielectric layers, the third conductive feature being at a greatest distance of the third electrical path from the top surface of the semiconductor substrate and in the direction normal to the top surface of the substrate, the third layer of the plurality of the dielectric layers being over the second layer of the plurality of the dielectric layers.

18. The IC structure of claim 13, wherein the first layer of the plurality of the dielectric layers is a dielectric layer of a lowest metallization layer.

19. The IC structure of claim 13, wherein the first signal device comprises a p-type transistor in the semiconductor substrate, and the second signal device comprises an n-type transistor in the semiconductor substrate, the second electrical path electrically coupling a source/drain region of the p-type transistor to a gate of the n-type transistor.

20. The IC structure of claim 13, wherein the first conductive features is an electrical fuse.

* * * * *